(12) United States Patent
Zhou et al.

(10) Patent No.: US 12,490,511 B2
(45) Date of Patent: Dec. 2, 2025

(54) STACKED COMPLEMENTARY FIELD EFFECT TRANSISTORS

(71) Applicant: International Business Machines Corporation, Armonk, NY (US)

(72) Inventors: Huimei Zhou, Albany, NY (US); Alexander Reznicek, Troy, NY (US); Miaomiao Wang, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 911 days.

(21) Appl. No.: 17/494,101

(22) Filed: Oct. 5, 2021

(65) Prior Publication Data

US 2023/0103999 A1   Apr. 6, 2023

(51) Int. Cl.
| | |
|---|---|
| H10D 84/85 | (2025.01) |
| H01L 21/02 | (2006.01) |
| H01L 23/528 | (2006.01) |
| H10D 30/01 | (2025.01) |
| H10D 30/67 | (2025.01) |
| H10D 62/10 | (2025.01) |
| H10D 84/01 | (2025.01) |
| H10D 84/03 | (2025.01) |

(52) U.S. Cl.
CPC ....... *H10D 84/856* (2025.01); *H01L 21/0259* (2013.01); *H01L 23/5286* (2013.01); *H10D 30/031* (2025.01); *H10D 30/6713* (2025.01); *H10D 30/6729* (2025.01); *H10D 30/6735* (2025.01); *H10D 30/6757* (2025.01); *H10D 62/118* (2025.01); *H10D 84/0167* (2025.01); *H10D 84/017* (2025.01); *H10D 84/0186* (2025.01); *H10D 84/0188* (2025.01); *H10D 84/038* (2025.01)

(58) Field of Classification Search
None
See application file for complete search history.

(56) References Cited

U.S. PATENT DOCUMENTS

| | | | |
|---|---|---|---|
| 5,874,836 | A | 2/1999 | Nowak |
| 9,748,352 | B2 | 8/2017 | Liu |
| 9,837,414 | B1 | 12/2017 | Balakrishnan |
| 9,847,390 | B1 | 12/2017 | Xie |
| 10,192,867 | B1 | 1/2019 | Frougier |
| 10,276,442 | B1 | 4/2019 | Xie |
| 10,418,449 | B2 | 9/2019 | Paul |
| 10,559,656 | B2 | 2/2020 | Bourjot |
| 10,818,674 | B2 | 10/2020 | Mann |

(Continued)

OTHER PUBLICATIONS

Vincent, "Practical Methods to Overcome the Challenges of 3D Logic Design", Coventor, Jun. 22, 2018, 6 pages.

*Primary Examiner* — Bo B Jang
(74) *Attorney, Agent, or Firm* — David K. Mattheis

(57) ABSTRACT

A CFET (complementary field effect transistor) structure including a first transistor disposed above a second transistor, a first source/drain region of the first transistor disposed above a second source/drain region of the second transistor, a first source/drain contact for the first source/drain region, and a second source drain contact for the second source drain region. The first source/drain contact is isolated from the second source/drain contact by an L-shaped isolation element including vertical and horizontal isolation elements.

14 Claims, 20 Drawing Sheets

(56) References Cited

U.S. PATENT DOCUMENTS

| | | |
|---|---|---|
| 10,886,369 B2 | 1/2021 | Zhang |
| 10,886,911 B2 | 1/2021 | Willard |
| 2012/0032274 A1 | 2/2012 | Erickson |
| 2019/0386011 A1* | 12/2019 | Weckx ............... H10D 84/0165 |

* cited by examiner

STACKED COMPLEMENTARY FIELD EFFECT TRANSISTORS

BACKGROUND

The disclosure relates generally to stacked complementary field effect transistors (CFET). The disclosure relates particularly to stacked CFET having an upper FET contact passing through to a substrate, where the upper FET contact is isolated from the lower FET contact by an L-shaped combination of vertical and horizontal isolation elements.

Integrated circuit (IC) chips are formed on semiconductor wafers at increasingly smaller scale. In current technology nodes, transistor devices are constructed as three-dimensional (3D) field effect transistor (FET) structures. However, chipmakers face a myriad of challenges at 5 nm, 3 nm and beyond. Currently, chip scaling continues to slow as process complexities and costs escalate at each node.

Complex gate-all-around technology includes complementary FET (CFET) where nFET and pFET nanowires/nanosheets are vertically stacked on top of each other. Buried power rail architectures provide a possible path forward in downscaling chip designs.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect a complementary field effect transistor (CFET) structure includes a first transistor disposed above a second transistor, a first source/drain region of the first transistor disposed above a second source/drain region of the second transistor, a first source/drain contact for the first source/drain region, and a second source drain contact for the second source drain region. The first source/drain contact is isolated from the second source/drain contact by an L-shaped combination of vertical and horizontal isolation elements.

In one aspect, a method of forming a complementary field effect transistor (CFET) device including forming stacked sets of field effect transistor channel elements, forming first source/drain regions for a first transistor, forming a vertical isolation region for the first source/drain region, and forming second source/drain regions for a second transistor above the vertical isolation region.

In one aspect, a CFET structure (complementary field effect transistor) including a first transistor disposed above a second transistor, a first source/drain contact for the first transistor, and a second source drain contact for the second transistor. The first source/drain contact is isolated from the second source/drain contact by vertical and horizontal isolation elements.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1A:
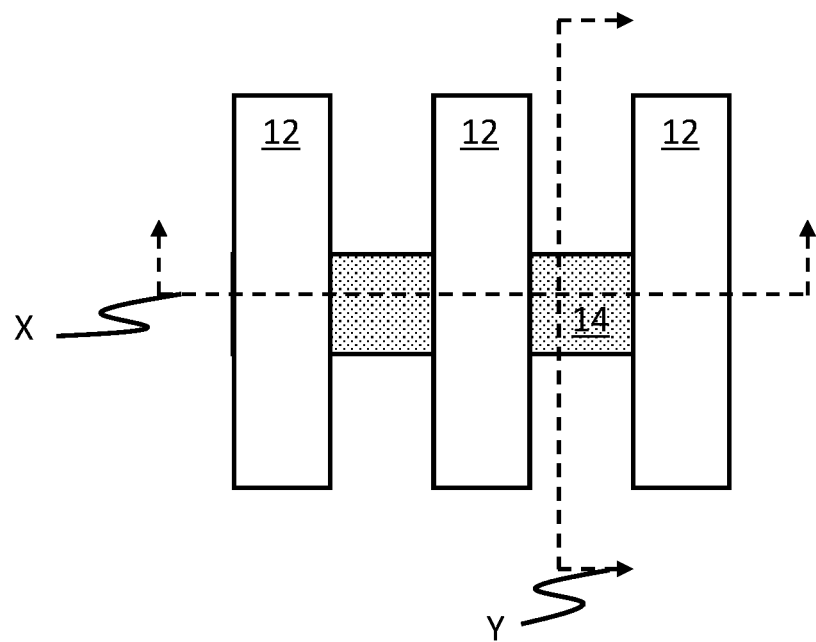
FIG. 1A provides a schematic plan view of device, according to an embodiment of the invention. The figure illustrates the location of the section lines associated with the respective views of FIGS. 1B-19.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials, process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried power rail interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liners and sacrificial materials include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

One of the processing complexities of CFETs that needs to be addressed at nodes beyond 5 nm is independently growing the nFET and pFET source/drain epitaxy while maintaining vertical integration and electrical disconnection. Using a conventional nanowire/nanosheet source/drain epitaxy process for CFETs forms superposed n-doped epitaxy and p-doped epitaxy, making it challenging to form independent upper and lower device source/drain region contacts to buried power rails and other buried connections having sufficient electrical isolation to prevent device shorting or other device reliability issues due to the close proximity of the upper and lower device source/drain (S/D) regions. Punching through the dielectric isolation layer separating upper and lower device source/drain epitaxial regions to form the buried power rail contact for the upper device tends to weaken the isolation layers effectiveness and gives rise to device electrical short circuits and other device reliability issues. Disclosed embodiments provide CFET structures and a method of forming CFETs with stacked S/D regions that maintain vertical integration and electrical disconnection of the nFET and pFET source/drain epitaxy while also having contacts passing through to buried power rail contact points.

Disclosed embodiments provide CFET structures including stacked and electrically isolated source/drain regions for CFET, where the formation of the via for the upper device contact is preceded by the formation of a vertical isolation element separating the epitaxial region of the lower device from the contact of the upper device. This process eliminated the need to punch through the upper/lower isolation layer with the inherent risk of weakening or otherwise reducing the effectiveness of the isolation layer between the upper and lower device epitaxial regions. This provides additional electrical isolation between the upper device contact and lower device contact while affording contacts from each device to buried power rails. Disclosed embodiments are described through examples embodying nanosheet field effect transistors. The invention should not be considered limited in any manner to the nanosheet structures of the examples.

Reference is now made to the figures. The figures provide schematic cross-sectional illustration of semiconductor devices at intermediate stages of fabrication, according to one or more embodiments of the invention. The figures provide a front cross-section (X) parallel to the nanosheet fins of the device, and side cross-section (Y), parallel to the gate structures of the device. The figures provide schematic representations of the devices of the invention and are not to be considered accurate or limiting with regards to device element scale.

FIG. 1A provides a schematic plan view of a device 100, according to an embodiment of the invention. As shown in the Figure, gate structures 12, are disposed perpendicular to nanosheet stack 14. Section lines X and Y indicate the viewpoints of the respective views of FIGS. 1B-17.

Figure 1B:
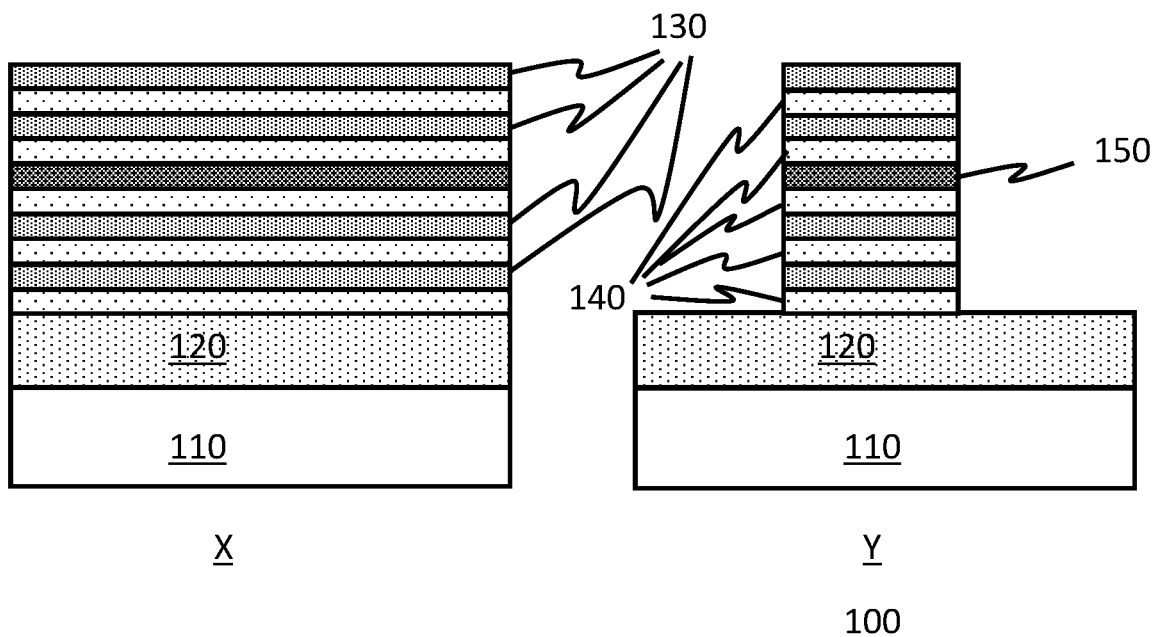
FIG. 1B provides a cross-sectional view of a step in the fabrication of a semiconductor device, according to an embodiment of the invention. The figure illustrates a formed and patterned stack of epitaxially grown nanosheet layers.

FIG. 1B provides a schematic view of a device 100 according to an embodiment of the invention following the deposition, patterning, and selective removal of material leaving a stack of layers for the formation of nanosheet CFET devices. In an embodiment, the stack includes alternating layers of epitaxially grown silicon germanium (SiGe) 140, 150, and silicon 130. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface.

Therefore, an epitaxial semiconductor material has the same crystalline characteristics as the deposition surface on which it is formed.

The nanosheet stack includes a bottom-most layer of a first semiconductor material, such as SiGe and a top-most layer of a second semiconductor material, such as Si. The nanosheet stack is depicted with ten layers (three SiGe layers and two Si layers forming a lower device, two SiGe layers and two Si layers forming an upper device, and a high Ge concertation, e.g., 50%-70% Ge, SiGe layer 150, separating the upper and lower devices), however any number and combinations of layers can be used so long as the layers alternate between SiGe and Si to form lower and upper devices and include a high Ge concentration SiGe layer separating the lower and upper devices. The nanosheet stack is depicted with the layers being in the form of nanosheets, however the width of any given nanosheet layer can be varied so as to result in the form of a nanowire, a nanoellipse, a nanorod, etc. SiGe layers 140, 150, can be composed of, for instance, $SiGe_{20-60}$, examples thereof including, but not limited to $SiGe_{20}$, $SiGe_{25}$, $SiGe_{30}$ . . . $SiGe_{65}$.

Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). An insulating layer 120 may be present on substrate 110 and, if present, is located between substrate 110 and the nanosheet stack. Insulating layer 120 can be, for example, a buried oxide layer (typically $SiO_2$) or a bottom dielectric isolation layer formed early in the process (typically SiN, SiBCN, SiOCN, SiOC, or any combination of low-k materials). In an embodiment, the insulating layer 120 further comprises one or more buried power rails (not shown) or other contacts associated with device elements formed in lower layers of the device.

In an embodiment, each sacrificial semiconductor material layer 140 and 150, is composed of a first semiconductor material which differs in composition from at least an upper portion of the semiconductor substrate 110. In one embodiment, the upper portion of the semiconductor substrate 110 is composed of silicon, while each sacrificial semiconductor material layers 140 and 150 is composed of a silicon germanium alloy. In such an embodiment, the SiGe alloy that provides each sacrificial semiconductor material layer 150 has a germanium content that is greater than 50 atomic percent germanium. In one example, the SiGe alloy that provides each sacrificial semiconductor material layer 150 has a germanium content from 50 atomic percent germanium to 70 atomic percent germanium. In such an embodiment, the SiGe alloy that provides each sacrificial semiconductor material layer 140 has a germanium content that is less than 50 atomic percent germanium. In one example, the SiGe alloy that provides each sacrificial semiconductor material layer 140 has a germanium content from 20 atomic percent germanium to 40 atomic percent germanium. The first semiconductor material that provides each sacrificial semiconductor material layers 140 and 150 can be formed utilizing an epitaxial growth (or deposition process).

Each semiconductor channel material layer 130, is composed of a second semiconductor material that has a different etch rate than the first semiconductor material of the sacrificial semiconductor material layers 140 and 150 and is also resistant to Ge condensation. The second semiconductor material of each semiconductor channel material layer 130, may be the same as, or different from, the semiconductor material of at least the upper portion of the semiconductor substrate 110. The second semiconductor material can be a SiGe alloy provided that the SiGe alloy has a germanium content that is less than 50 atomic percent germanium, and that the first semiconductor material is different from the second semiconductor material.

In one example, at least the upper portion of the semiconductor substrate 110 and each semiconductor channel material layer 130 is composed of Si or a III-V compound semiconductor, while each sacrificial semiconductor material layer 140, 150 is composed of a silicon germanium alloy. The second semiconductor material of each semiconductor channel material layer 130, can be formed utilizing an epitaxial growth (or deposition process).

Following deposition of the stack of layers 130, 140, and 150, across the surface of the device die, the layers are patterned using a process such as lithographic masking, and selectively etched, yielding a pattern of device fins including stacks of upper and lower device nanosheets separated by sacrificial layers of semiconductor materials. Such stacks define the active regions of the devices.

Figure 2:
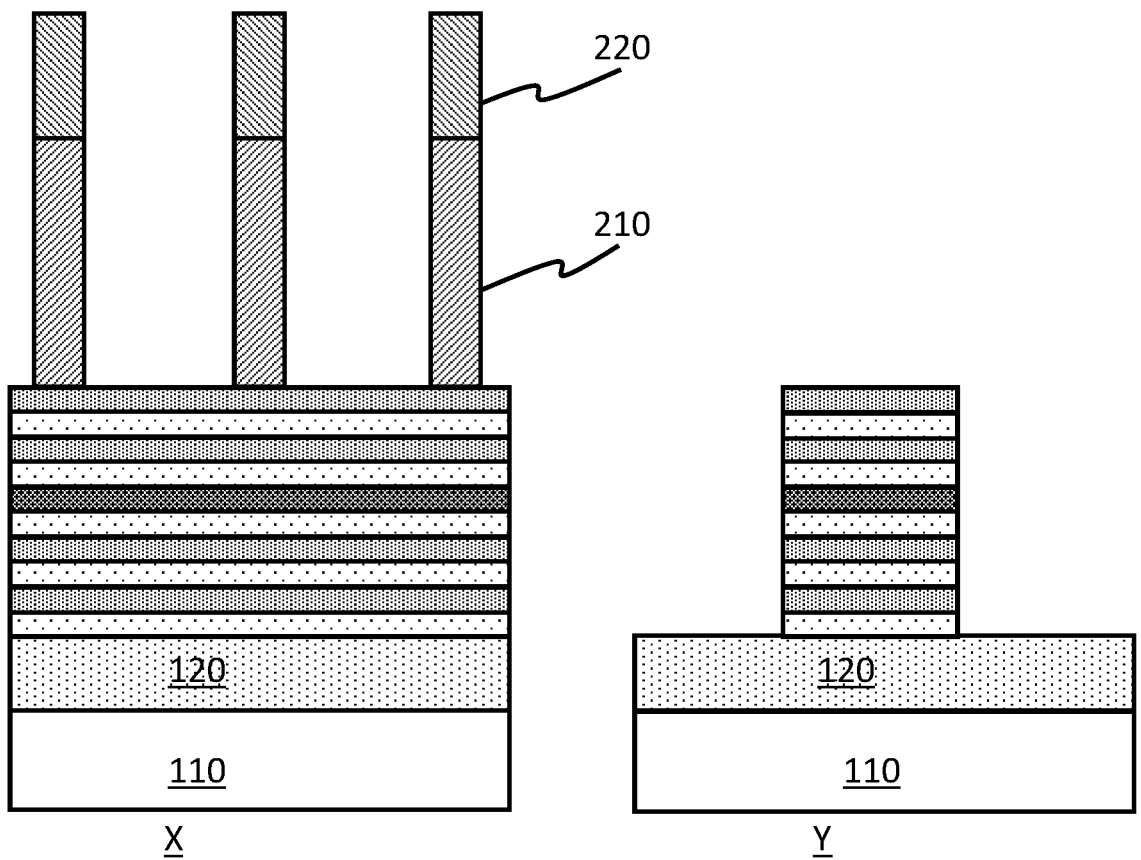
FIG. 2 provides a cross-sectional view of a step in the fabrication of a semiconductor device, according to an embodiment of the invention. The figure illustrates dummy gate structures formed above the stack of nanosheet layers.

FIG. 2 illustrates device 100 following the forming at least one dummy gate structure on the nanosheet stack. Three dummy gates are shown however any number of gates can be formed. Dummy gate structures can be formed by depositing a dummy gate material 210 over the nanosheet stack. The dummy gate material can be, for example, a thin layer of oxide, followed by polycrystalline silicon, amorphous silicon or microcrystal silicon. After that, a hardmask layer 220 is deposited over the dummy gate, followed by lithographic patterning, masking, and etching processes yielding the dummy gate fins of the Figure.

In an embodiment, hardmask 220 includes a nitride, oxide, an oxide-nitride bilayer, or another suitable material. In some embodiments, the hardmask 220 may include an oxide such as silicon oxide (SiO), a nitride such as silicon nitride (SiN), an oxynitride such as silicon oxynitride (SiON), combinations thereof, etc. In some embodiments, the hardmask 220 is a silicon nitride such as $Si_3N_4$.

Figure 3:
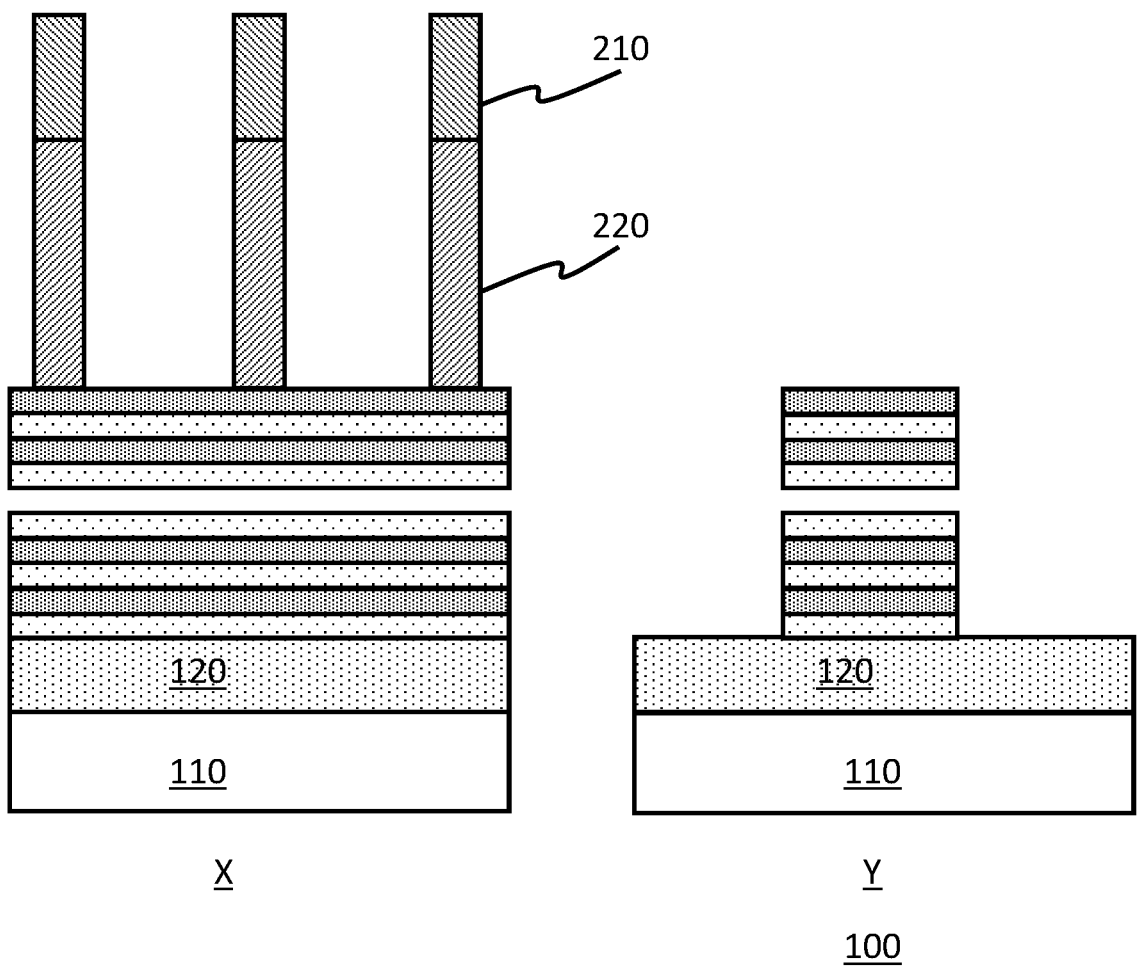
FIG. 3 provides a cross-sectional view of a step in the fabrication of a semiconductor device, according to an embodiment of the invention. The figure illustrates the device after the removal of a sacrificial layer between upper and lower nanosheet elements.

FIG. 3 illustrates device 100 following selective removal of sacrificial layer 150 separating the upper and lower FET devices of the CFET. In an embodiment, the high Ge concentration SiGe of layer 150 may be selectively etched away without removal of sacrificial layers 140, or channel layers 130, due to the higher concentration of Ge of sacrificial layer 150 compared to sacrificial layers 140, or channel layers 130.

Figure 4:
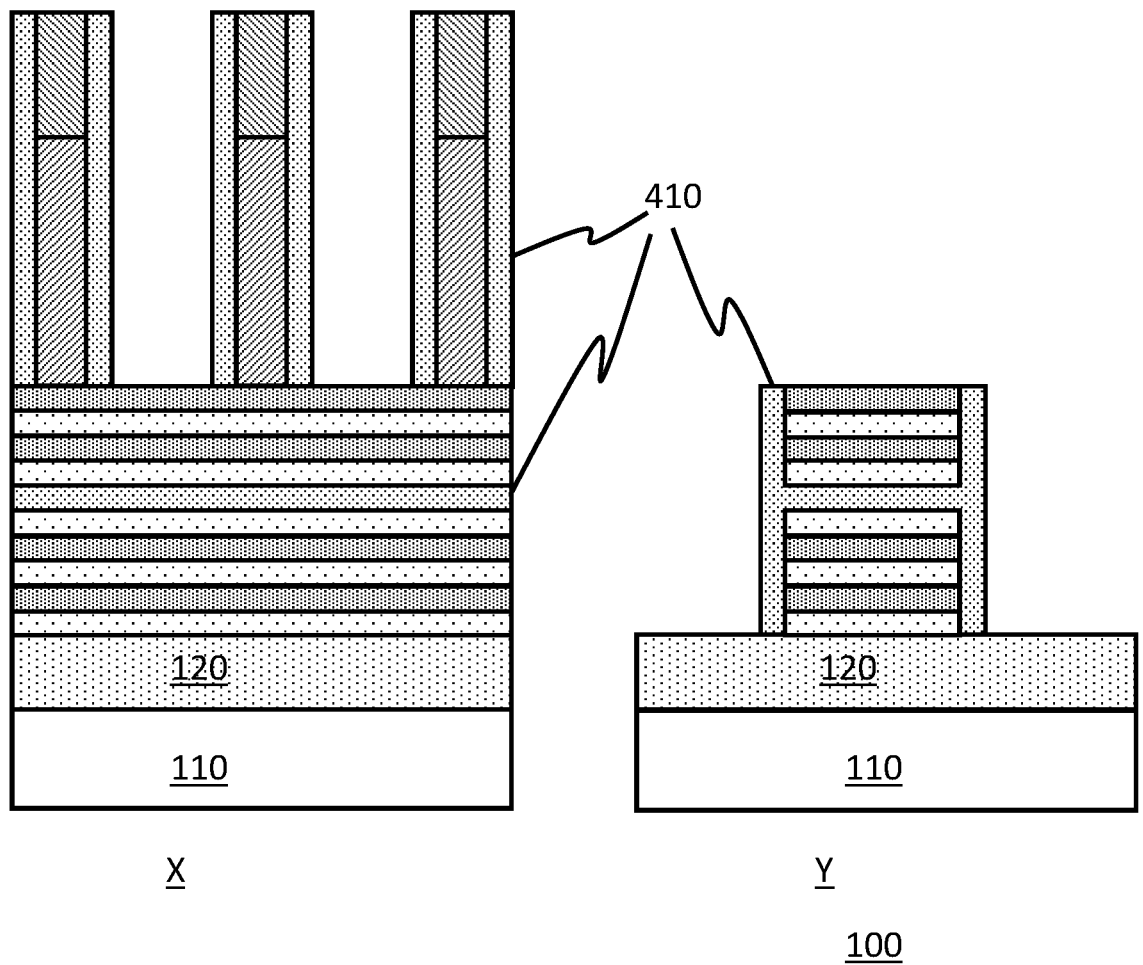
FIG. 4 provides a cross-sectional view, of a step in the fabrication of a semiconductor device, according to an embodiment of the invention. The figure illustrates the device after the addition of a dielectric spacer between nanosheet devices and the addition of protective dielectric sidewalls to the dummy gate structures.

FIG. 4 illustrates device 100 following conformal deposition and selective etching of spacer materials to fill the void left by removal of layer 150. Spacer material 410 further forms sidewall spacers along the sidewalls of dummy gate structure 210, hardmask 220, and sidewall of the nanosheet stack at S/D epi region. In an embodiment, spacer material 410 may be the same material as hardmask 220, or may be different materials and may be comprised of any one or more of a variety of different insulative materials, such as $Si_3N_4$, SiBCN, SiNC, SiN, SiCO, $SiO_2$, SiNOC, etc. In this embodiment, after conformal deposition, selective etching, such as anisotropic reactive ion etching, removes spacer material 410 from horizontal surfaces of the intermediate stage of the device 100.

Figure 5:
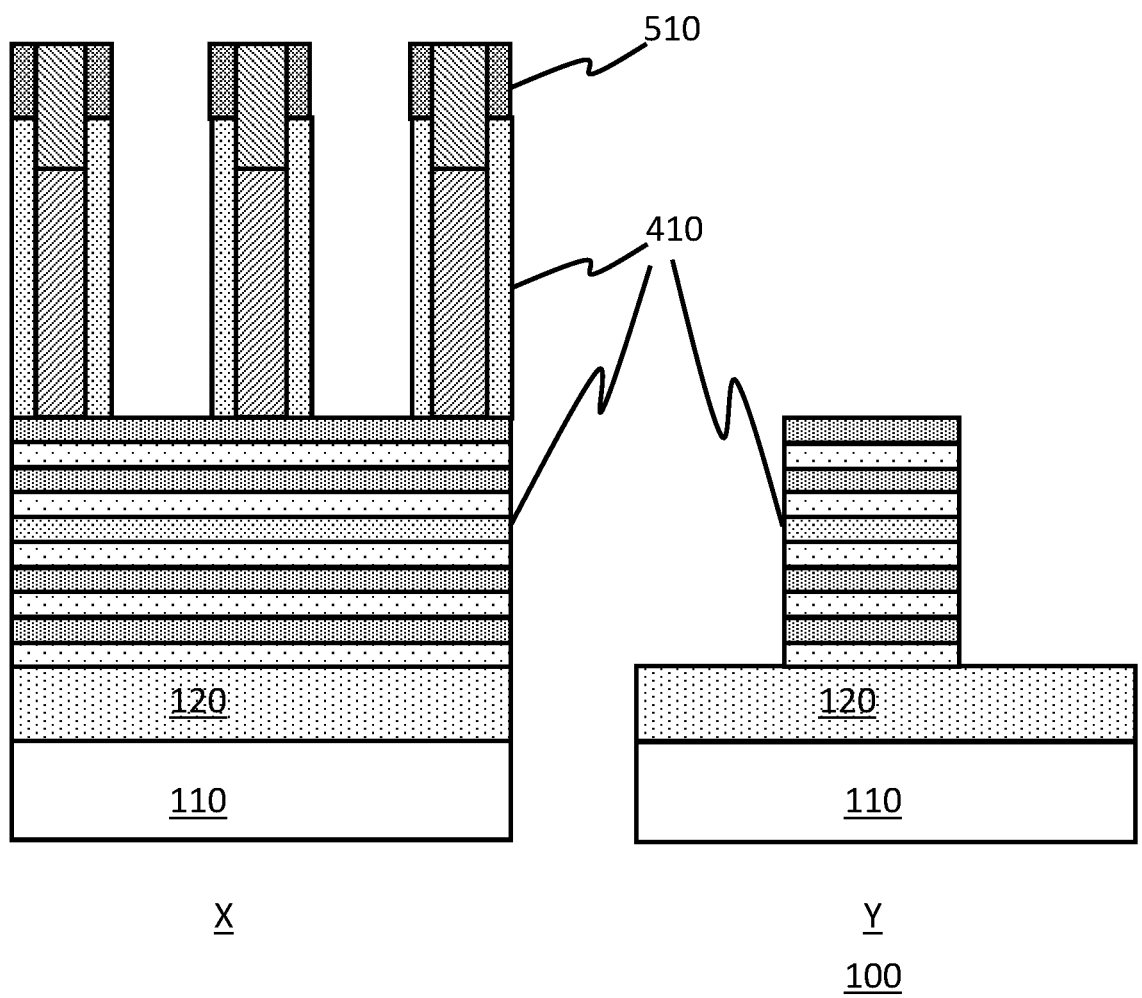
FIG. 5 provides a cross-sectional view of a step in the fabrication of a semiconductor device, according to an embodiment of the invention. The figure illustrates the device after the selective removal of excess dielectric material from vertical surfaces.

FIG. 5 illustrates device 100 after selective removal of spacer sidewall materials 410 from the vertical surfaces of the stack of nanosheets 130-140. In an embodiment, anisotropic etching is used to selectively remove the vertical sidewall spacers from the nanosheet stacks. In an embodiment, following partial removal of spacer material 410 from the vertical surfaces of hardmask 220, formation of a protective cap 510, through deposition of a material such as SiC, or $SiO_2$, upon the exposed vertical surfaces of hardmask 220, provides protection against excessive removal of spacer materials 410 from the dummy gate 210 and hardmask 220.

In an embodiment, formation of protective cap 510 includes: depositing a sacrificial material, such as OPL, over the wafer, followed by etching back the OPL to reveal the top portion of the gate spacer 410, at sidewall of the hardmask 220, while spacers at sidewalls of the nanosheet stack at S/D regions are still fully covered by OPL. After that, the exposed spacer 410 is selectively removed, followed by deposition of protective cap 510, and anisotropic etching back. Removal of the sacrificial material (OPL) occurs, e.g., through an N2/H2 ash process. Finally, an anisotropic spacer etch process can be done to etch down the sidewall spacer at the nanosheet stack at S/D regions without pulling down the spacer 410 at gate sidewall which is under protective cap 510.

Figure 6:
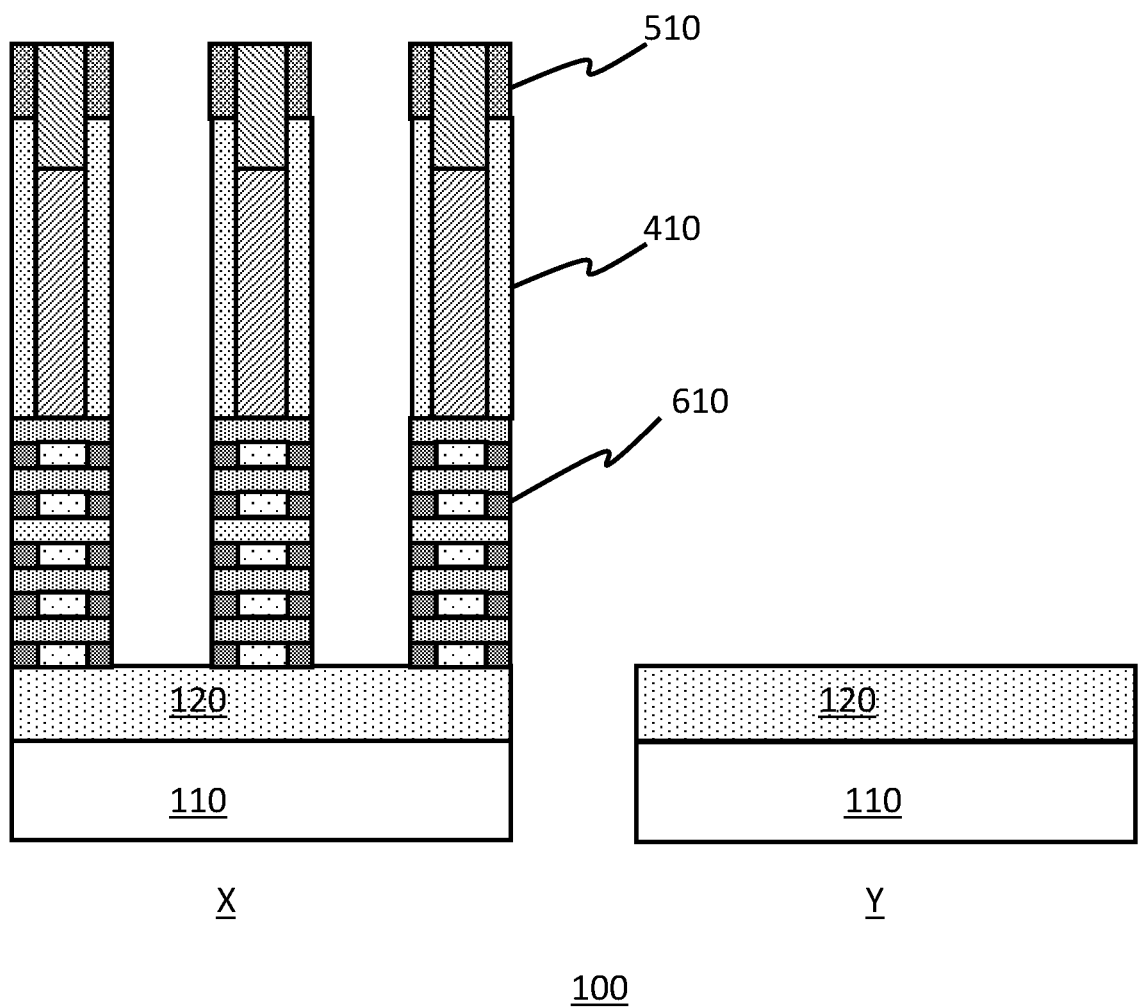
FIG. 6 provides a cross-sectional view of a step in the fabrication of a semiconductor device, according to an embodiment of the invention. The figure illustrates the device after recessing the individual CFET stacks and the formation of inner CFET stack spacers.

FIG. 6 illustrates device 100 following recessing the nanosheet stack layers 130, 140, and spacer layer 410, from between adjacent dummy gate structures, to form the S/D cavities for CFET devices. FIG. 6 further illustrates device 100 following formation of inner spacers between nanosheets of the respective FET devices. Portions of nanosheet stack layers 130, 140, and 410, which are not underneath gate spacers 410, and not underneath dummy gate 210, are removed through etching. Etching generally refers to the removal of material from a substrate (or structures formed on the substrate) and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching.

After generally etching the nanosheet stack between the dummy gate structures to the upper surface of the insulating layer 120, a selective etching of SiGe layers 140 of the nanosheet stack removes portions which are underneath gate spacers 410. Inner spacers 610 are then formed in etched-away portions, and thus are located under gate spacers 410. Inner spacers 610 can be composed of any suitable dielectric material, for example $Si_3N_4$, SiBCN, SiNC, SiN, SiCO, $SiO_2$, SiNOC, etc. The inner spacers are formed by a conformal dielectric liner deposition followed by isotropic etching back, so dielectric liner is removed everywhere except the regions pinched-off in those under spacer cavities.

Figure 7:
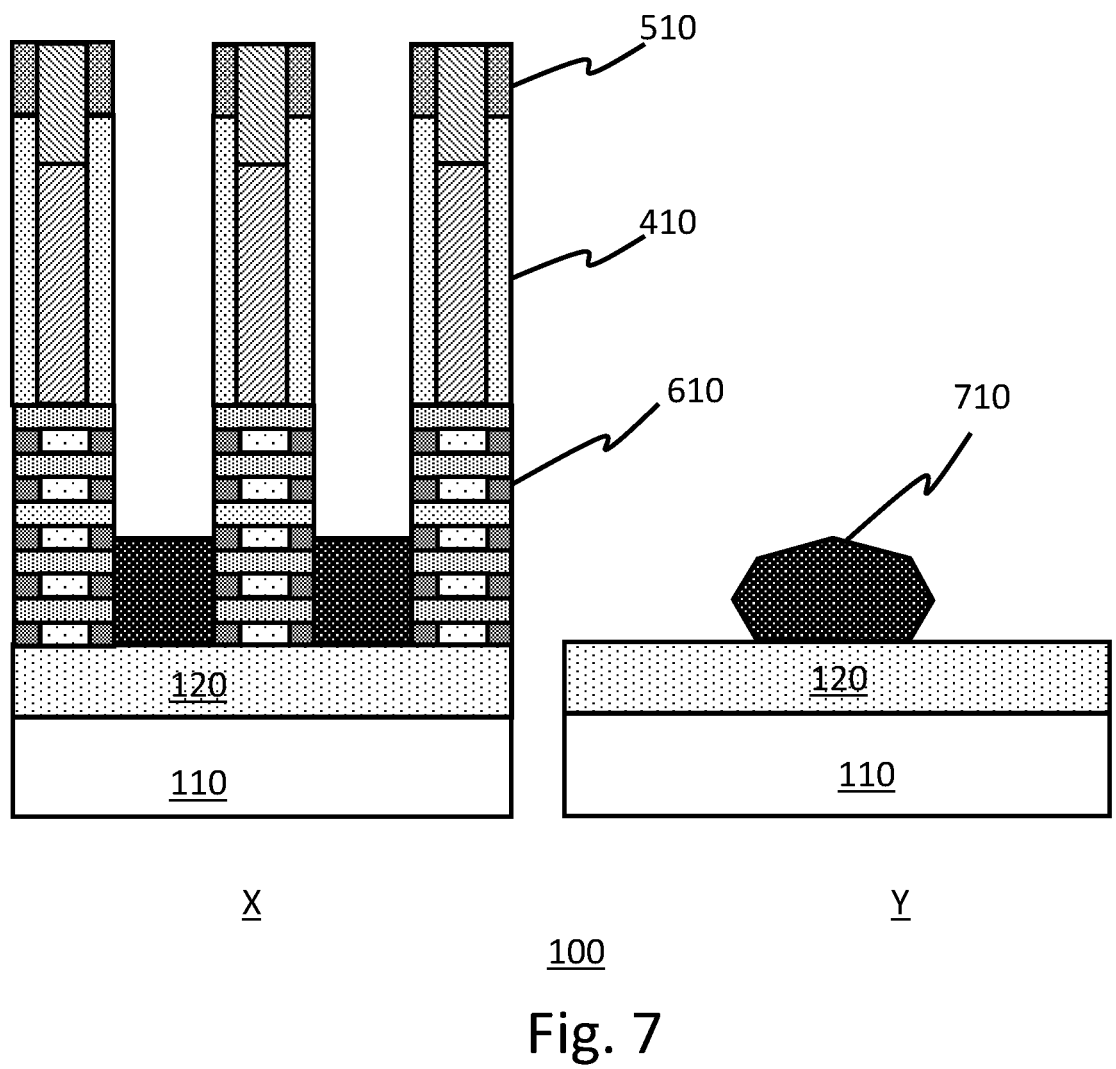
FIG. 7 provides a cross-sectional view of a step in the fabrication of a semiconductor device, according to an embodiment of the invention. The figure illustrates the device after the epitaxial formation of source/drain regions for the lower nanosheet device.

FIG. 7 illustrates device 100 following epitaxial growth of source/drain regions 710, for the lower FET device of the CFET. In an embodiment, pairs of epitaxial source/drain regions are formed on opposing sides of nanosheet stacks and dummy gate structures. In an embodiment, boron doped SiGe (SiGe:B) is epitaxially grown from exposed semiconductor surfaces (layer 130). In an embodiment, deposition of a sacrificial material, such as OPL, covers the bottom nanosheet channel 130 sidewalls. A sacrificial spacer, such as a thin SiO2 or SiN, then covers the top nanosheet channel 130 sidewalls. The sacrificial material, such as OPL, can be removed by N2/H2 ash, followed by bottom S/D epitaxial 710 growth. After that, the sacrificial spacer can be removed from the top nanosheet channel 130 sidewalls. Growth of bottom S/D regions 710 includes overgrowth of the regions followed by recessing, patterning and selectively etching away unwanted epitaxial growth, leaving the final desired S/D region elements.

In the present embodiments, the source/drain regions 710 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. In an embodiment, the upper S/D regions of the device comprise n-type material and the lower regions comprise p-type materials. In an embodiment, the upper S/D regions comprise p-type materials and the lower regions comprise n-type materials.

Figure 8:
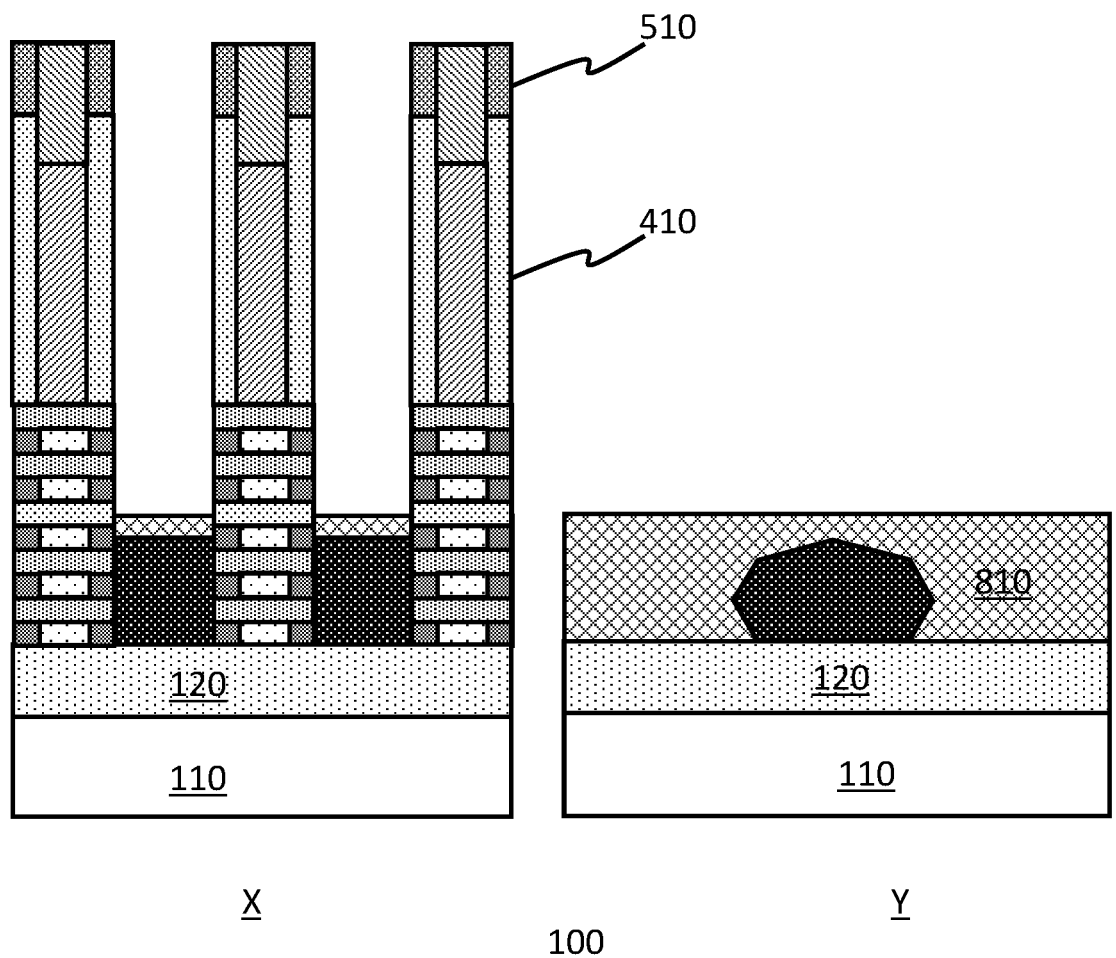
FIG. 8 provides a cross-sectional view of a step in the fabrication of a semiconductor device, according to an embodiment of the invention. The figure illustrates the device after the deposition of a protective sacrificial dielectric around the source/drain regions of the lower nanosheet device.

FIG. 8 illustrates device 100 following deposition, and recess of a sacrificial spacer layer 810, such as $TiO_x$, ($TiO_2$) around lower source/drains 710. This can be achieved by a conformal deposition of sacrificial spacer 810 to pinch-off the gate-to-gate space or just overfill the sacrificial spacer material then followed by a CMP to a desired upper surface height for the sacrificial layer 810.

Figure 9:
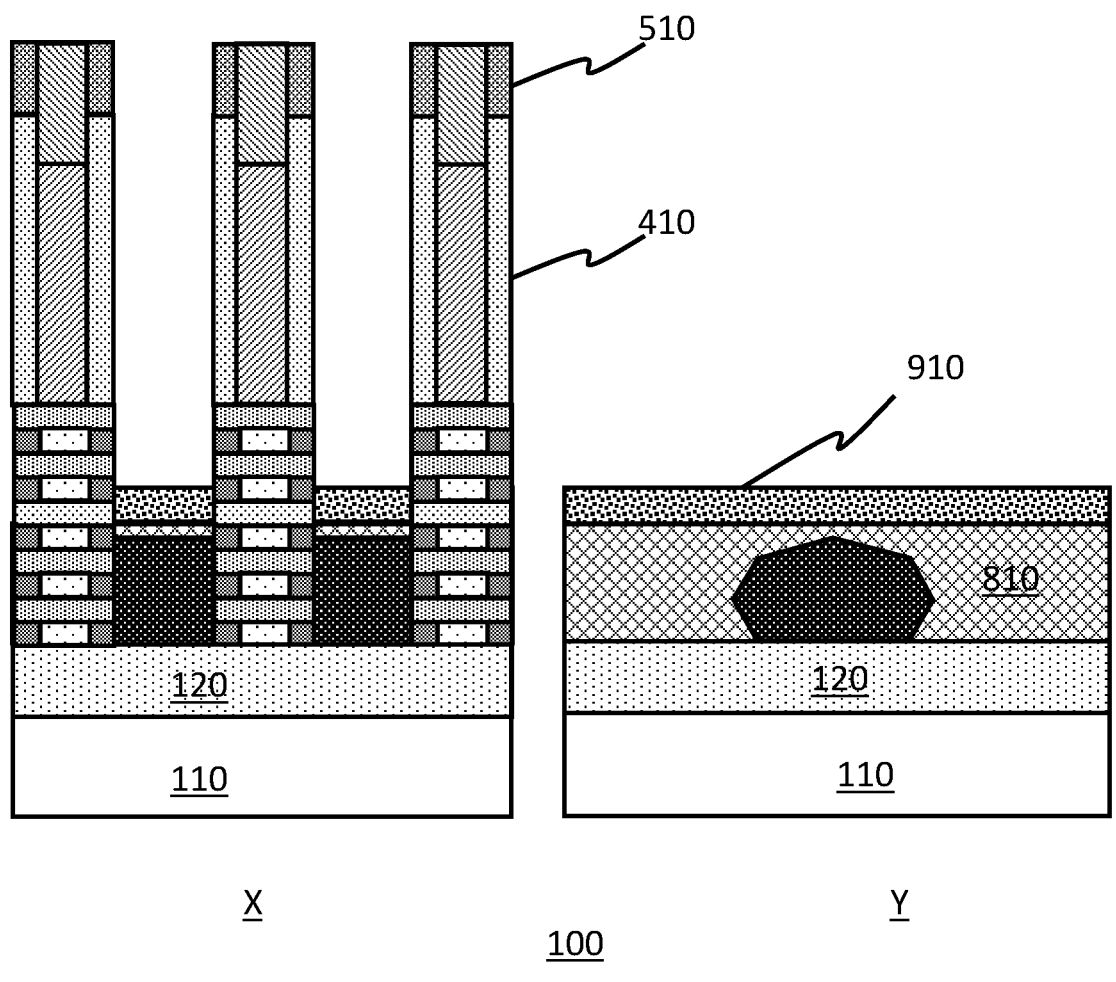
FIG. 9 provides a cross-sectional view of a step in the fabrication of a semiconductor device, according to an embodiment of the invention. The figure illustrates the device after the deposition of a horizontal isolation layer upon the sacrificial dielectric.

FIG. 9 illustrates device 100 following deposition, CMP and recess of isolating layer 910 above sacrificial layer 810. In an embodiment, isolation layer 910 constitutes a material such as SiO2, SiN, SiOC, and combinations of these.

Figure 10:
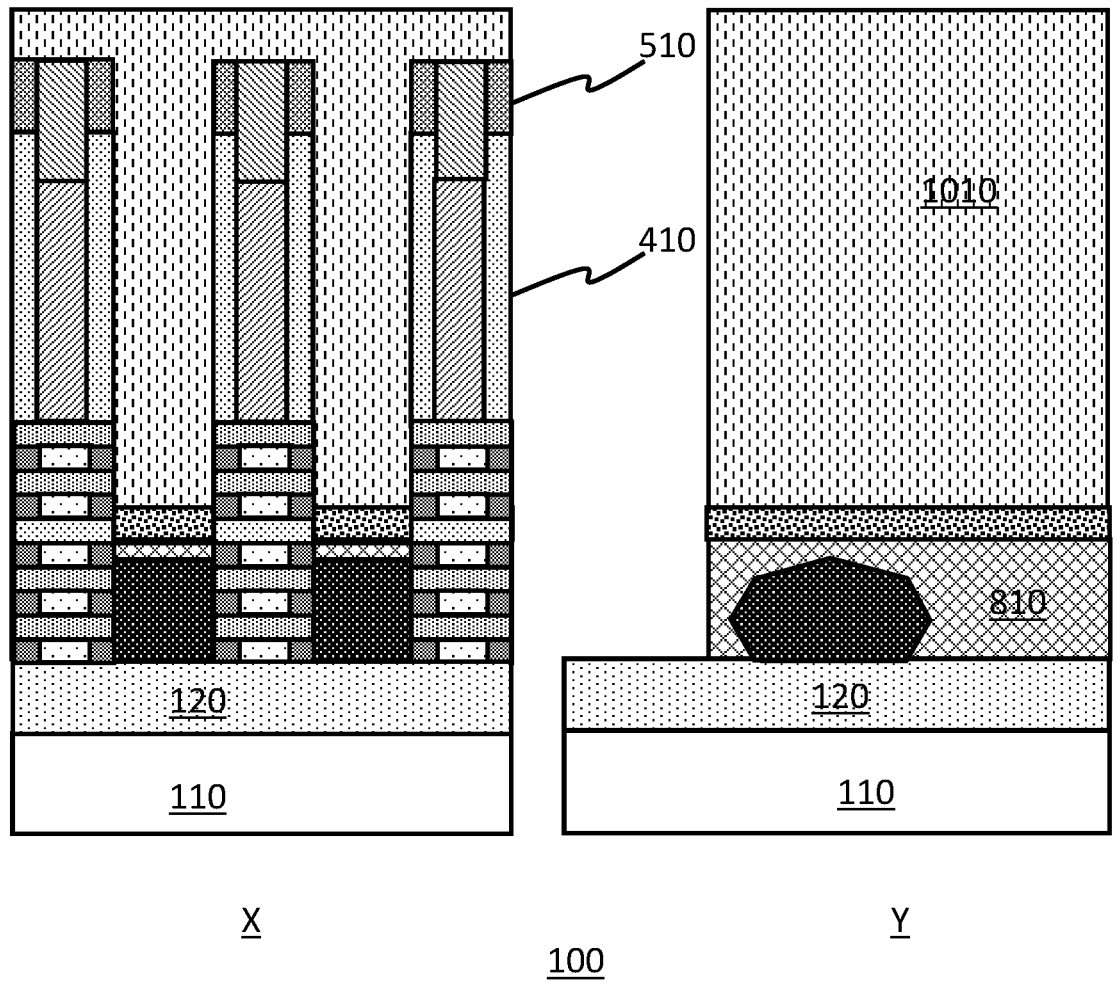
FIG. 10 provides a cross-sectional view of a step in the fabrication of a semiconductor device, according to an embodiment of the invention. The figure illustrates the device after removal of the horizontal isolation and sacrificial dielectric along one side of the lower device S/D regions.

FIG. 10 illustrates device 100 following selective masking of isolating layer 910 and sacrificial layer 810 with OPL 1010 and the subsequent removal of isolating layer 910 and sacrificial material 810 disposed to the left of lower S/D region 710 in cross-sectional view Y. OPL 1010 is subsequently removed through an ashing process.

Figure 11:
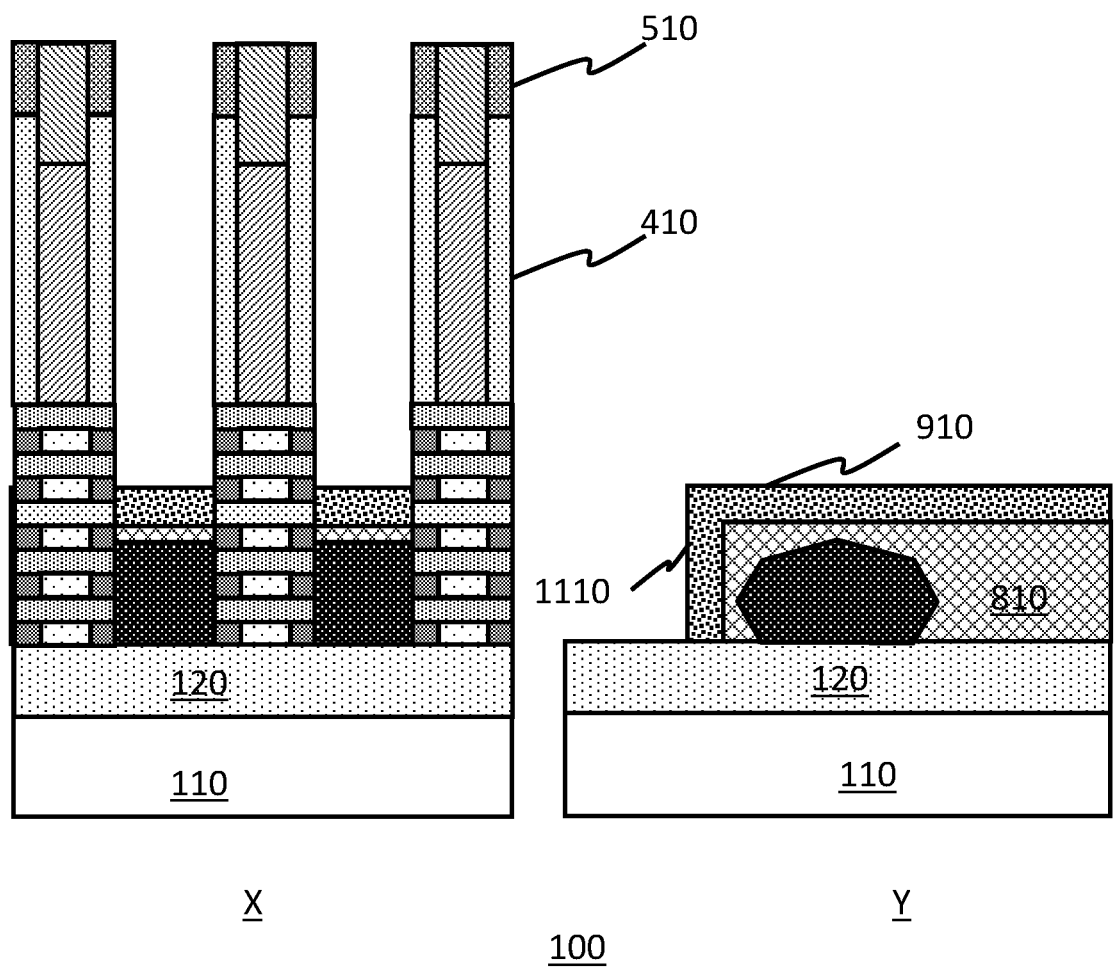
FIG. 11 provides a cross-sectional view of a step in the fabrication of a semiconductor device, according to an embodiment of the invention. The figure illustrates the device after deposition of a vertical protective dielectric associated with the S/D regions of the lower nanosheet devices.

FIG. 11 illustrates device 100 following deposition, CMP and recess of vertical isolating layer 1110 adjacent to sacrificial layer 810 and lower device S/D region 710. In an embodiment, isolation layer 1110 constitutes a material such as SiO2, SiN, SiOC, and combinations of these, similar or identical to the materials used in forming isolating layer 910. In an embodiment, this material is deposited upon the exposed surfaces of the device and selectively etched from all but the vertical surface of sacrificial material layer 810, and isolation layer 910.

Figure 12:
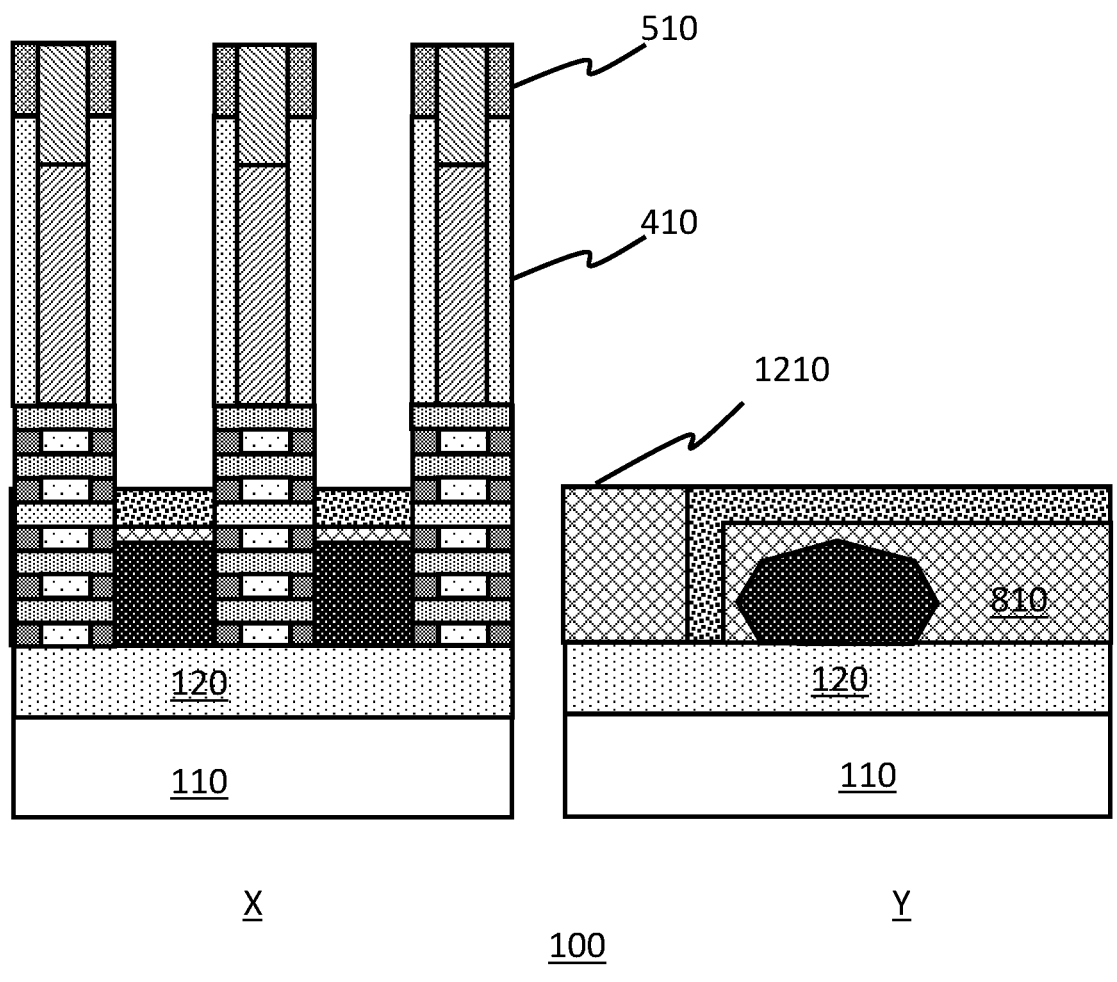
FIG. 12 provides a cross-sectional view of a step in the fabrication of a semiconductor device, according to an embodiment of the invention. The figure illustrates the device after the deposition of lower sacrificial material adjacent to the vertical isolation element.

FIG. 12 illustrates device 100 following deposition, CMP and recess of sacrificial material layer 1210 adjacent to vertical isolation layer 1110. In an embodiment, a material such as that used for sacrificial material layer 810, $TiO_x$ ($TiO_2$), or similar is used.

Figure 13:
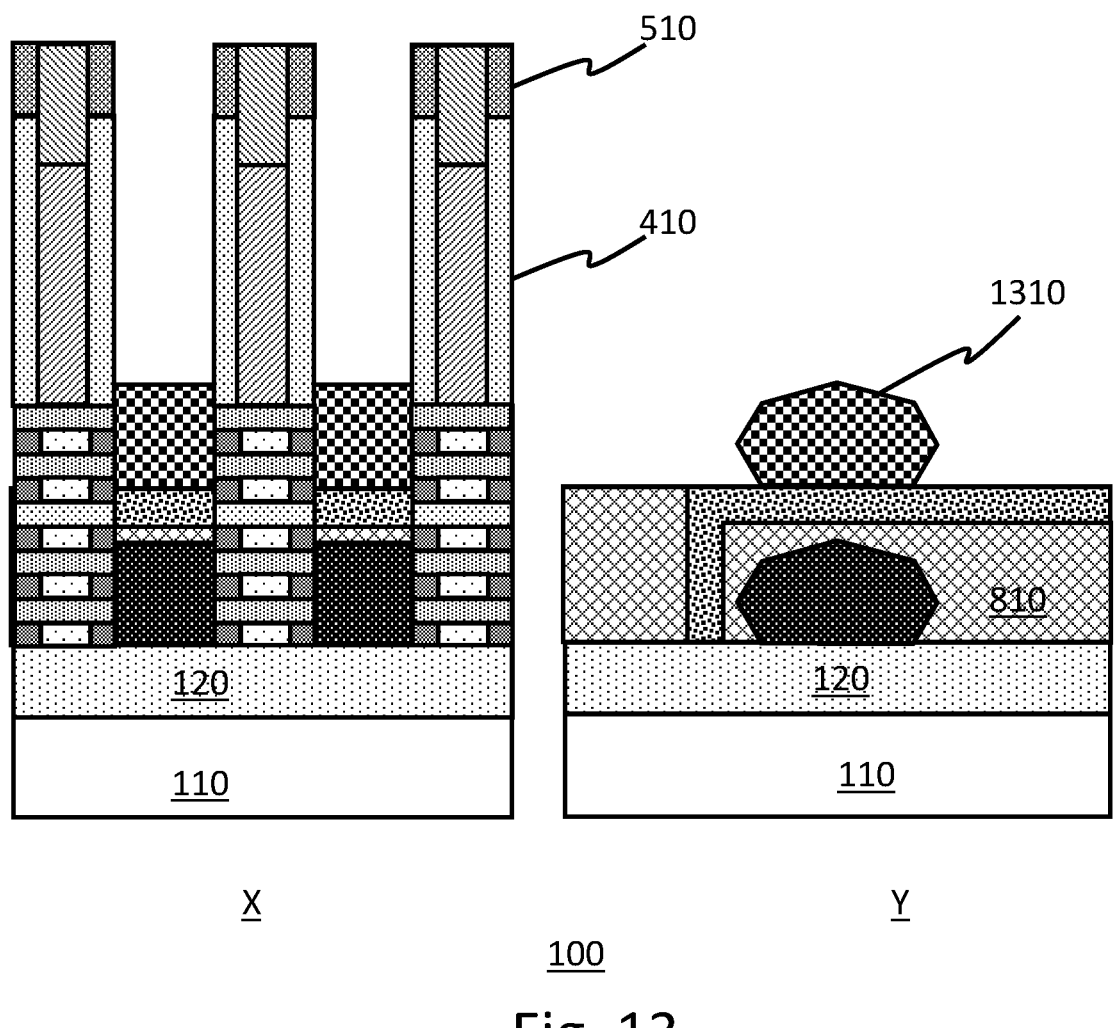
FIG. 13 provides a cross-sectional view of a step in the fabrication of a semiconductor device, according to an embodiment of the invention. The figure illustrates the device after the epitaxial growth of upper device source/drain regions.

FIG. 13 illustrates device 100 following epitaxial growth of pairs of upper device S/D regions 1310. In an embodiment, epitaxial growth of phosphorous doped Si (Si:P) provides S/D regions for nFET devices of the CFET. S/D regions 1310 contact and are grown from nanosheet channel layers 130 of the upper FET device.

The disclosed example provides for the fabrication of a CFET device having an upper nFET and a lower pFET. In an embodiment, the CFET includes an upper pFET and a lower nFET. In this embodiment, the appropriate doping of the upper and lower S/D regions results in the desired pattern of nFET and pFET for the CFET device.

Figure 14:
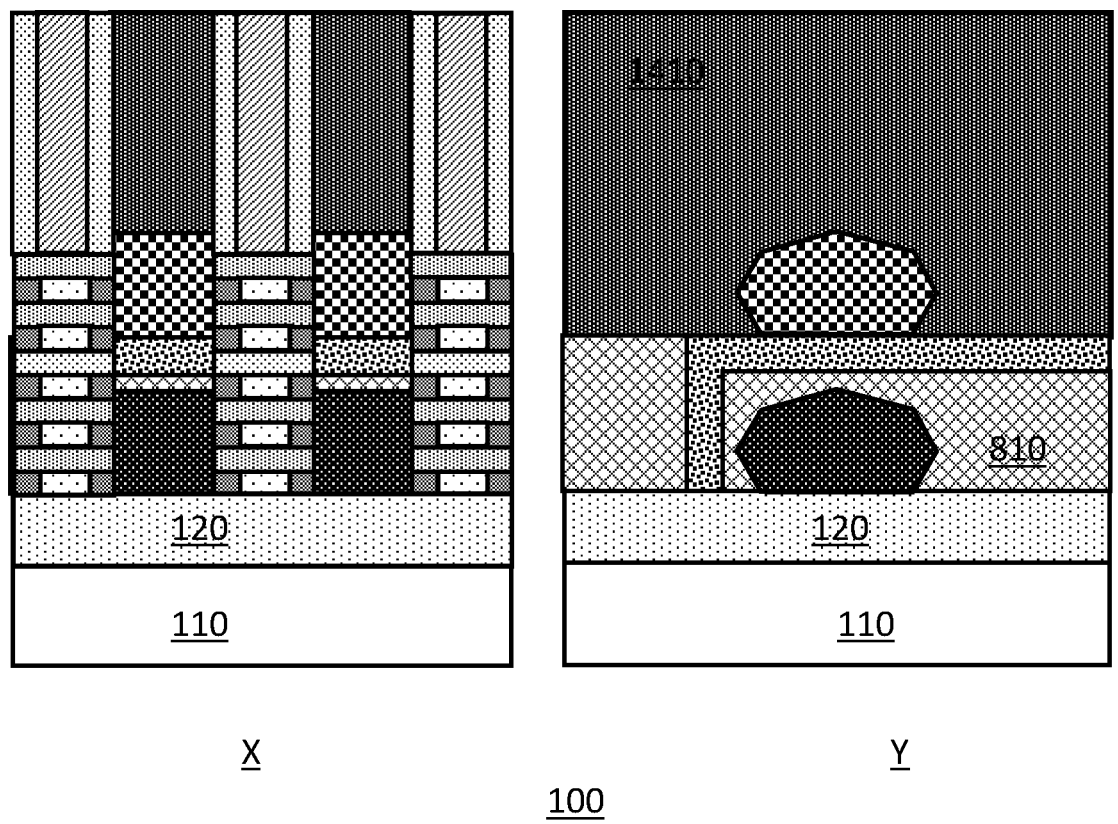
FIG. 14 provides a cross-sectional view of a step in the fabrication of a semiconductor device, according to an embodiment of the invention. The figure illustrates the device after encapsulation of the upper device source/drain regions.

FIG. 14 illustrates device 100 following deposition and CMP of an interlayer dielectric (ILD) material 1410, around and above the upper S/D epitaxy and the dummy gates and gate spacers 410. The Figure illustrates the device after CMP removal of protective caps 510, and hardmasks 220 from the dummy gate structures 210, exposing the upper surfaces of dummy gate 210 materials. In an embodiment, ILD 1410 constitutes a material such as SiO2, SiN, SiOC, and combinations of these.

Figure 15:
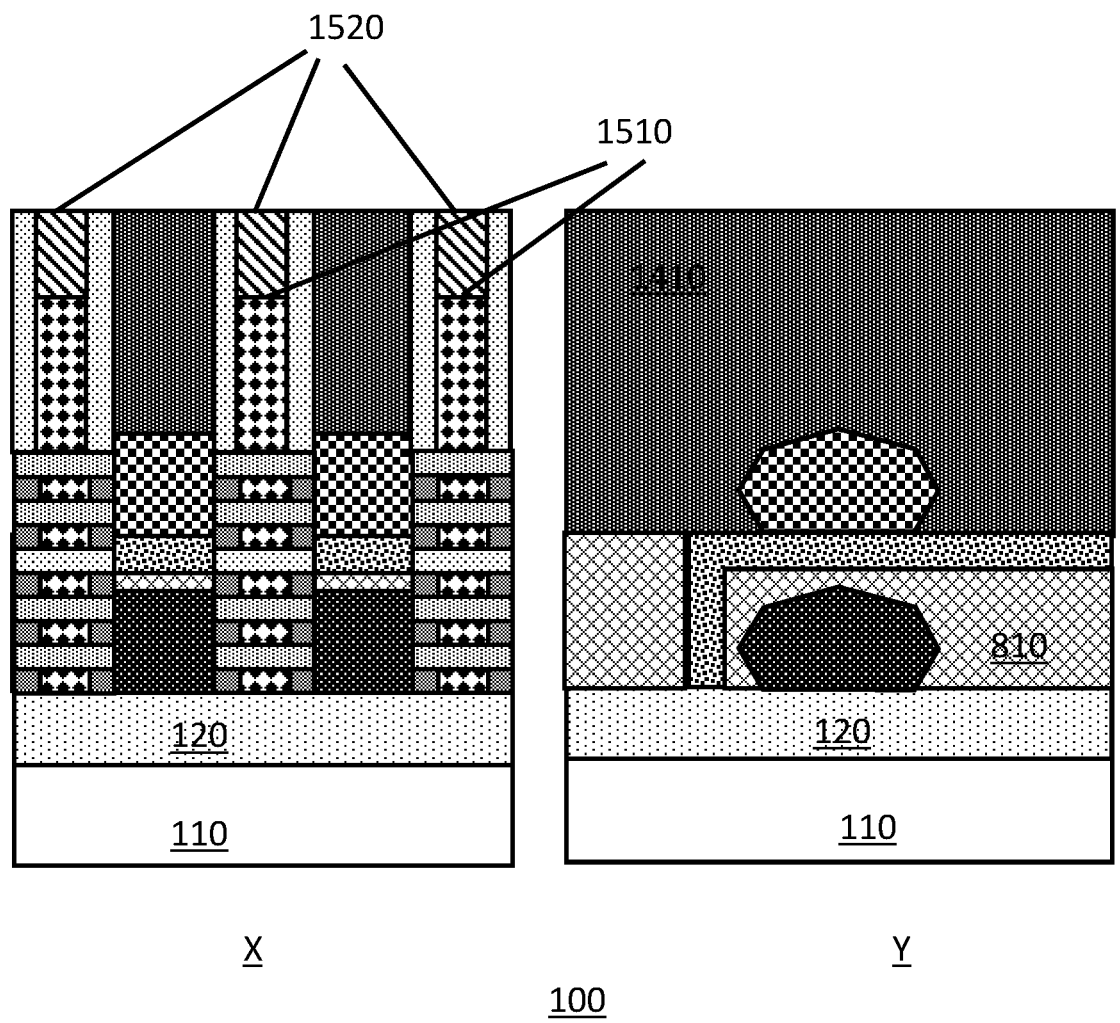
FIG. 15 provides a cross-sectional view of a step in the fabrication of a semiconductor device, according to an embodiment of the invention. The figure illustrates the device after formation of high-k metal gate structures for the upper and lower devices.

FIG. 15 illustrates device 100 following the removal of dummy gate 210, sacrificial SiGe 140, and formation of the high-k metal gate (HKMG) stack 1510, and a protective gate dielectric cap 1520. As shown in the Figure, a replacement metal gate structure has been formed in the void space created by removal of the dummy gate 210, and sacrificial SiGe layers 140. Gate structure 1510 includes gate dielectric and gate metal layers (not shown). The gate dielectric is generally a thin film and can be silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. Metal gate may be formed via known deposition techniques, such as atomic layer deposition, chemical vapor deposition, or physical vapor deposition. It should be appreciated that a chemical mechanical planarization (CMP) process can be applied to the top surface.

In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG 1510, the HKMG 1510 can be optionally recessed followed by a deposition and CMP of a gate dielectric cap material 1520 completes the replacement metal gate fabrication stage for the device.

Figure 16:
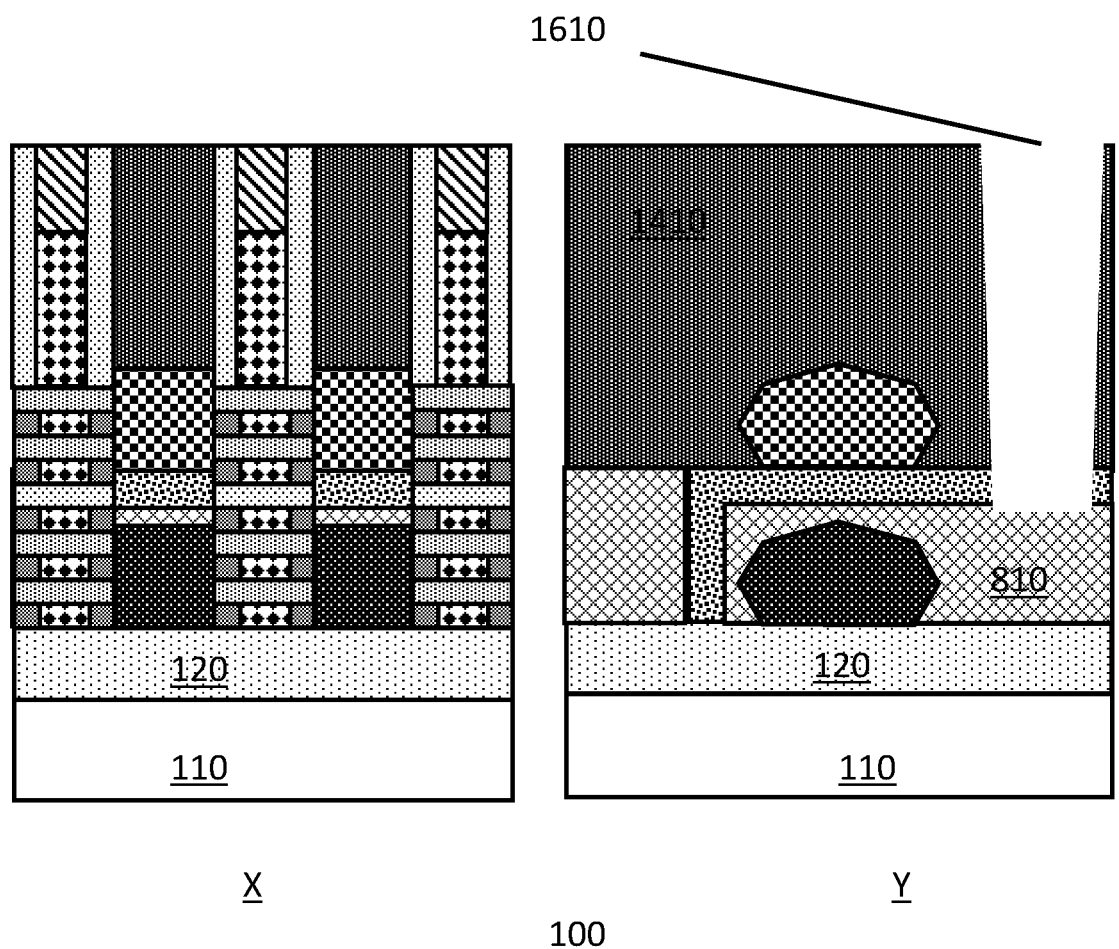
FIG. 16 provides a cross-sectional view of a step in the fabrication of a semiconductor device, according to an embodiment of the invention. The figure illustrates the device after formation of a lower device source/drain region contact via.

FIG. 16 illustrates device 100 following the formation of contact vias 1610 from an upper ILD surface to the upper surface of sacrificial material layer 810. The fabrication method utilizes selective etching, such as RIE in forming the via. The via exposes the sacrificial material layer 810.

Figure 17:
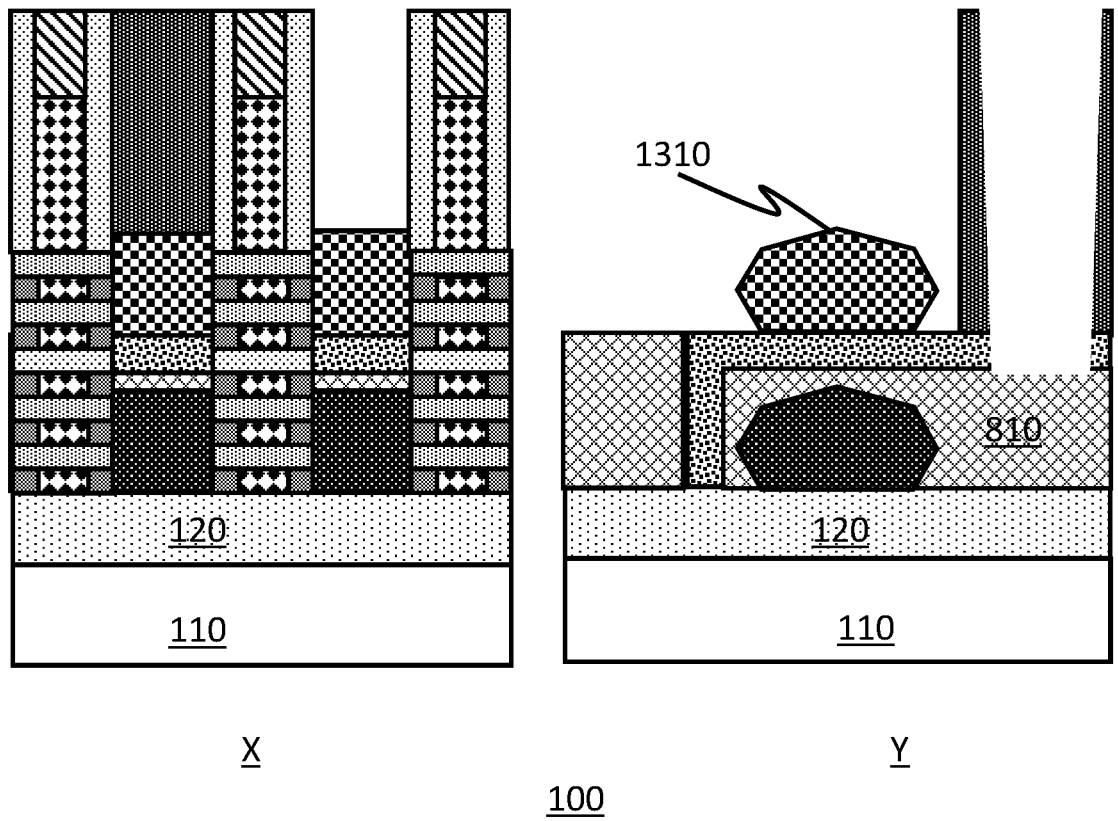
FIG. 17 provides a cross-sectional view of a step in the fabrication of a semiconductor device, according to an embodiment of the invention. The figure illustrates the device after formation of the upper device contact trench.

FIG. 17 illustrates device 100 following removal of ILD material 1410 from around upper device S/D epitaxy 1310. As shown in cross-section Y of the Figure, the ILD material 1410, has been removed, exposing upper device S/D region 1310.

Figure 18:
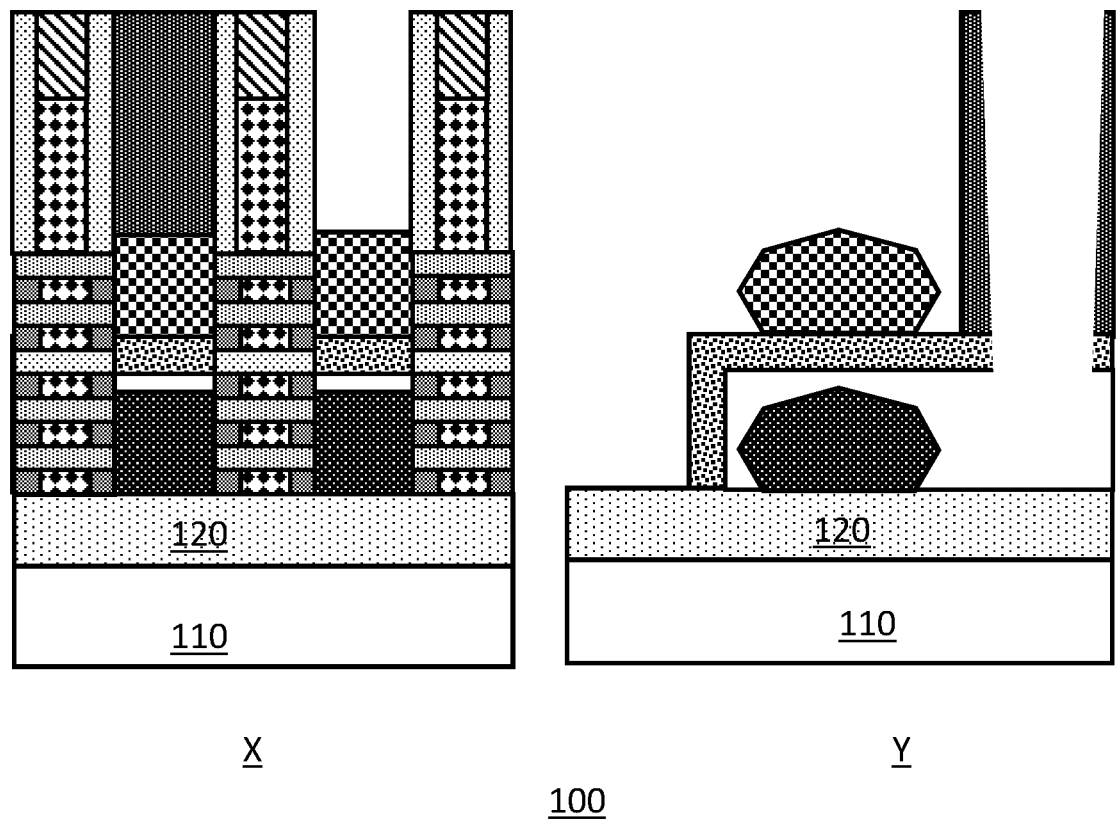
FIG. 18 provides a cross-sectional view of a step in the fabrication of a semiconductor device, according to an embodiment of the invention. The figure illustrates the device after removal of sacrificial materials.

FIG. 18 illustrates device 100 following removal of the sacrificial material 810 from its position adjacent to lower device S/D regions 710, as well as removal of sacrificial material 1210. As shown in cross-section Y of the Figure, the sacrificial semiconductor materials 810, and 1210, have been removed, exposing vertical isolating layer 1110, and isolating layer 120. In this manner, formation of the contact trench for the upper device S/D region proceeds to the lower isolation layer 120 and contacts embedded therein, without the need for a potentially compromising punch through etching of isolation layer 910 between the upper and lower device S/D regions.

Figure 19:
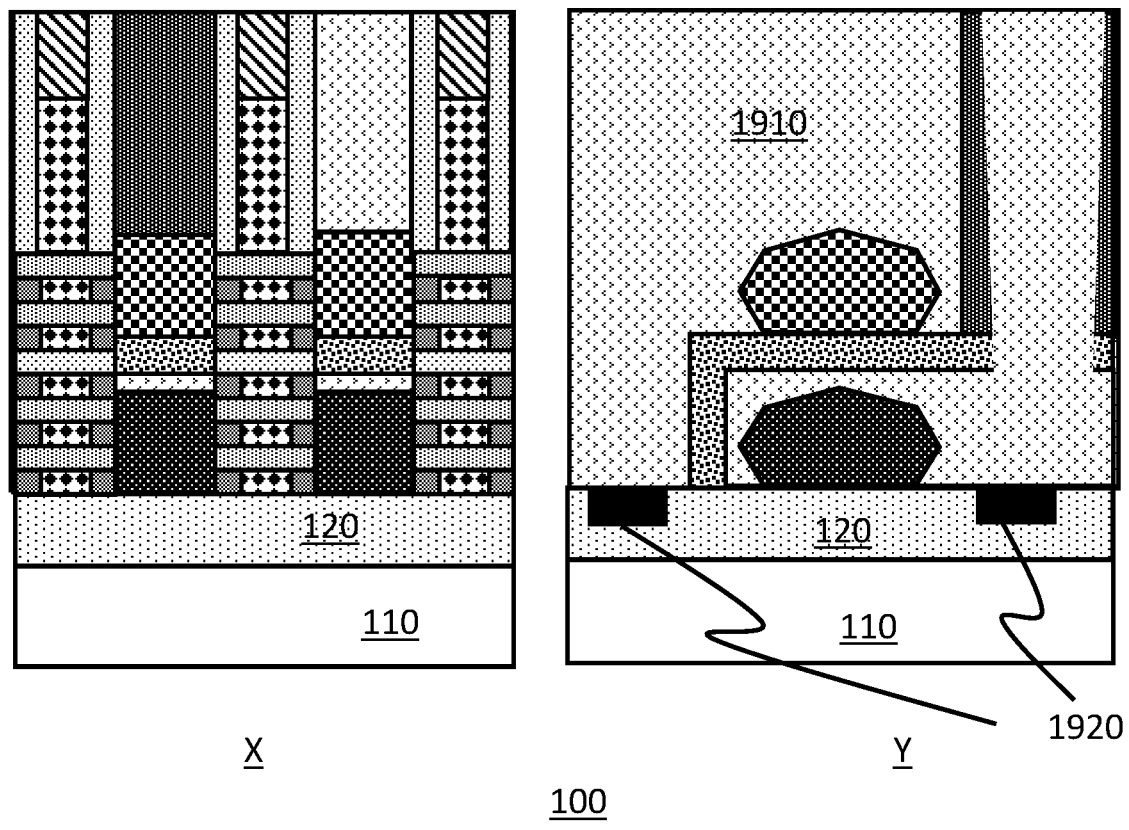
FIG. 19 provides a cross-sectional view of a step in the fabrication of a semiconductor device, according to an embodiment of the invention. The figure illustrates the device after the formation of metal source/drain region contacts.

FIG. 19 illustrates device 100 following the deposition of a wraparound metal S/D contact 1910 in the S/D regions contact vias. In an embodiment, deposition of silicide liner such as Ti, Ni, Co, NiPt, followed by deposition of an adhesion metal liner, such as a thin layer of TiN, followed by deposition of a conductive metal such as Cu, Ag, Au, W, Co, Ru, or combinations thereof, forms the contact. The geometry of the contact reduces the contact resistance by increasing the silicide surface area between the contact and S/D epi with the S/D regions. As further shown in the Figure, contacts 1910 for the device S/D regions connect to buried power rails 1920, disposed in isolating layer 120 through previously executed fabrication steps.

Figure 20:
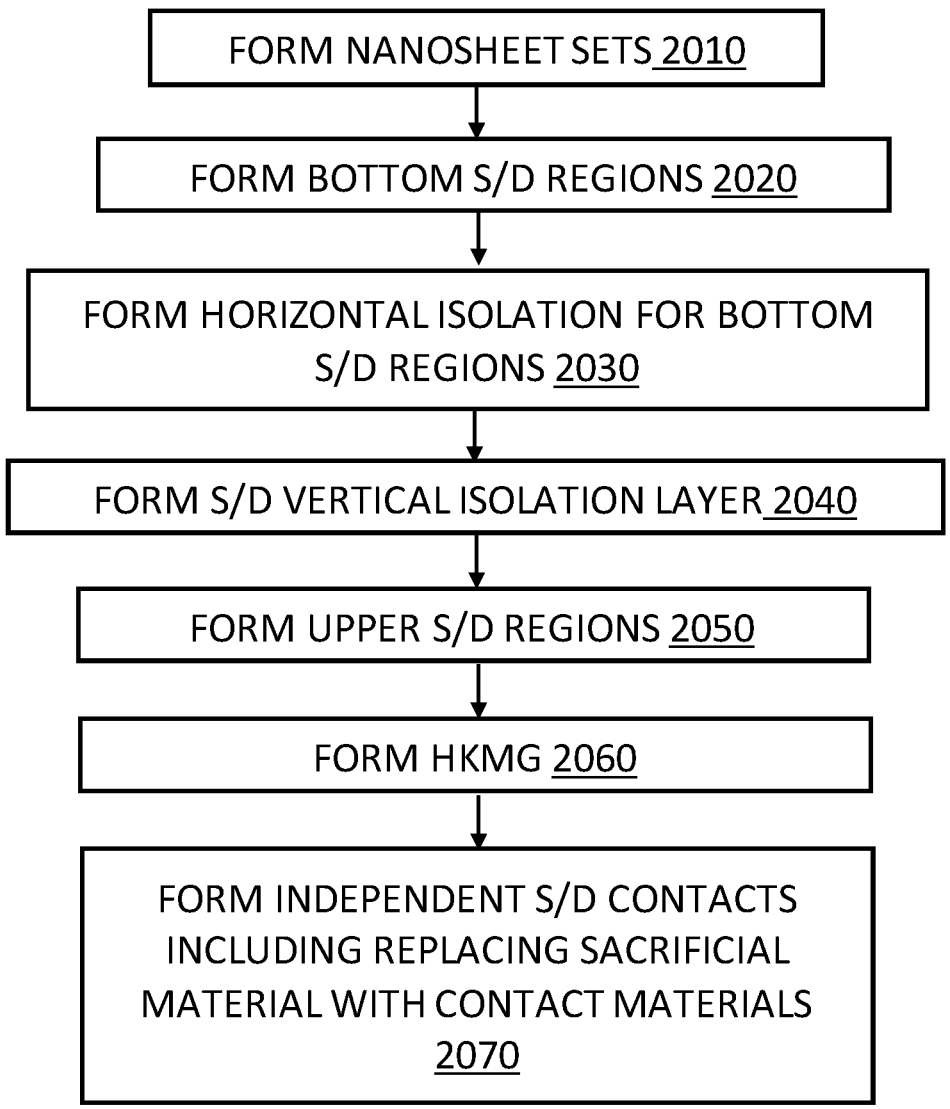
FIG. 20 provides a flowchart depicting operational steps for forming semiconductor device, according to an embodiment of the invention.

FIG. 20 depicts a fabrication process flowchart 2000, according to an embodiment of the invention. As shown in flowchart 2000, at block 2010, nanosheet sets for the CFET devices are formed. Stacks of alternating nanosheet layers of differing semiconductor materials are epitaxially grown upon an underlying substrate, or upon an insulating layer disposed upon a substrate. The stacks include sacrificial layers and channel layers. The channel layers form the nanosheet channels of the upper and lower FETs of the CFET. The layers are patterned and etched to form fins upon the underlying substrate. Dummy gate structures including gate sidewall spacers are added atop and along the fins. The nanosheet layers are recessed to align with the dummy gate spacers and inner spacers between nanosheet channel layers are formed to isolate the gates from the S/D regions of the devices.

At block 2020, S/D regions for the lower device are epitaxially grown upon the device in contact with the lower device nanosheet channel layers. The S/D regions are patterned and etched back to form the final lower device S/D regions in contact with the lower FET nanosheet channel layers. Prior to growing the lower S/D regions, the upper device semiconductor channels are shielded with a thin layer of sacrificial protective material thereby preventing epitaxial growth from the upper device semiconductor channels.

At block 2030, a horizontal isolation layer is formed above the lower device S/D regions. This layer forms a portion of the eventual L-shaped isolation structure physically and electrically separating the upper device and lower device S/D contacts.

At block 2040, a vertical isolation layer is formed adjacent to the lower S/D region and surrounding sacrificial material. Portions of the horizontal isolation layer and sacrificial layer are selectively etched away. The vertical isolation material is then conformally deposited and selectively etched leaving the vertical isolation element. The vertical isolation element is formed adjacent to the lower device S/D regions and the remaining sacrificial material layer.

The vertical isolation layer merges with the horizontal isolation layer above the lower device S/D region, forming an "L-shaped" isolation region between the upper and lower FET devices.

At block 2050, upper device S/D regions are formed from the upper device semiconductor nanosheet channels and upon the horizontal isolation layer upper surface.

At block 2060, the HKMG structure is formed as a replacement for the dummy gate structure between and adjacent to the upper and lower device S/D regions. In an embodiment, the dummy gate is removed, and a high-k layer is deposited followed by deposition of a work function metal and completed by deposition of a sacrificial protective cap upon the HKMG structure.

At block 2070, independent source/drain contacts are formed for CFET device. Contact trenches are etched through protective dielectric material layers to expose the upper S/D regions and the sacrificial material disposed around the lower S/D regions of a first side of the devices. A first trench exposes the upper S/D region on one side of the devices, this trench extends through lower sacrificial material, exposing the upper surface of isolation layer 120. A second trench exposes the sacrificial material adjacent to the lower S/D region on the same side of the devices. This sacrificial material is then removed exposing the lower S/D regions and the lower isolation layer. In an embodiment, a third common trench exposes the upper and lower S/D regions of the other side of the devices as well as the lower isolation layer. Contact metal is then disposed in the vias providing electrically independent contacts to each of the upper and lower S/D regions of the devices with buried contacts such as buried power rails for the devices.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A stacked CFET (complementary field effect transistor) structure comprising:
    a first transistor disposed above a second transistor;
    a first source/drain region of the first transistor disposed above a second source/drain region of the second transistor;
    a first source/drain contact for the first source/drain region; and
    a second source/drain contact for the second source/drain region;
    wherein the first source/drain contact is isolated from the second source/drain contact by a vertical isolation element disposed between and in contact with the first source/drain contact and the second source/drain contact and a horizontal isolation element disposed beneath and in contact with the first source/drain region, above the second source/drain region, and in contact with the first source/drain contact and the second source/drain contact.

2. The CFET structure according to claim 1, wherein the vertical and horizontal isolation elements comprise an L-shaped isolation element.

3. The CFET structure according to claim 1, further comprising a buried power rail disposed in contact with the first source/drain contact.

4. The CFET structure according to claim 1, further comprising a buried power rail disposed in contact with the second source/drain contact.

5. The CFET structure according to claim 1, further comprising a metal gate associated with at least one of the first source/drain region and the second source/drain region.

6. The CFET structure according to claim 1, wherein the first transistor comprises an nFET.

7. The CFET structure according to claim 1, wherein the first transistor comprises a pFET.

8. A CFET (complementary field effect transistor) structure comprising:
    a first transistor disposed above a second transistor;
    a first source/drain contact for the first transistor; and
    a second source/drain contact for the second transistor;
    wherein the first source/drain contact is isolated from the second source/drain contact by a vertical isolation element disposed between and in contact with the first source/drain contact and the second source/drain contact and a horizontal isolation element disposed beneath and in contact with the first source/drain region, above the second source/drain region, and in contact with the first source/drain contact and the second source/drain contact.

9. The CFET structure according to claim 8, wherein the vertical and horizontal isolation elements comprise a continuous isolation element.

10. The CFET structure according to claim 8, further comprising a buried power rail disposed in contact with the first source/drain contact.

11. The CFET structure according to claim 8, further comprising a buried power rail disposed in contact with the second source/drain contact.

12. The CFET structure according to claim 8, further comprising a metal gate associated with at least one of the first source/drain region and the second source/drain region.

13. The CFET structure according to claim 8, wherein the first transistor comprises an nFET.

14. The CFET structure according to claim 8, wherein the first transistor comprises a pFET.

* * * * *